(12) United States Patent
Tamaki et al.

(10) Patent No.: US 11,036,463 B2
(45) Date of Patent: Jun. 15, 2021

(54) TERMINAL DEVICE, CONTROL METHOD, AND AUDIO DATA REPRODUCTION SYSTEM

(71) Applicant: SONY CORPORATION, Tokyo (JP)

(72) Inventors: Hiroshi Tamaki, Kanagawa (JP); Koji Fujita, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/491,666

(22) PCT Filed: Jan. 24, 2018

(86) PCT No.: PCT/JP2018/002069
§ 371 (c)(1),
(2) Date: Sep. 6, 2019

(87) PCT Pub. No.: WO2018/168209
PCT Pub. Date: Sep. 20, 2018

(65) Prior Publication Data
US 2020/0012475 A1    Jan. 9, 2020

(30) Foreign Application Priority Data

Mar. 13, 2017  (JP) .............................. JP2017-047678

(51) Int. Cl.
*G06F 3/16*        (2006.01)
*H04R 3/04*        (2006.01)
(Continued)

(52) U.S. Cl.
CPC .............. *G06F 3/165* (2013.01); *H04R 3/04* (2013.01); *H03G 5/165* (2013.01); *H04W 88/02* (2013.01)

(58) Field of Classification Search
CPC ... H04R 3/04; H04R 3/06; H04R 3/08; H04R 3/10; H04R 5/04; H04R 2420/07;
(Continued)

(56) References Cited

U.S. PATENT DOCUMENTS 9,913,011 B1 *  3/2018 Giuliani .................... H04R 1/00
2012/0269365 A1 * 10/2012 Ochiai ...................... H03F 1/26
                                                     381/120

FOREIGN PATENT DOCUMENTS

CN        102656800        9/2012
CN        104581510        4/2015
(Continued)

OTHER PUBLICATIONS

International Search Report prepared by the Japan Patent Office dated Mar. 30, 2018, for International Application No. PCT/JP2018/002069.
Official Action (with English translation) for Chinese Patent Application No. 201880016328.9, dated Nov. 2, 2020, 13 pages.

*Primary Examiner* — Leshui Zhang
(74) *Attorney, Agent, or Firm* — Sheridan Ross P.C.

(57) ABSTRACT

Provided is a terminal device including: a communication unit that communicates with an audio reproduction device; a sound quality adjustment unit that performs sound quality adjustment on audio data; and a control unit that determines whether or not the audio reproduction device has a sound quality adjustment function depending on a communication result of communication based on a predetermined protocol, and turns on or off the sound quality adjustment function of the sound quality adjustment unit depending on a determination result.

6 Claims, 3 Drawing Sheets

(51) Int. Cl.
*H04W 88/02* (2009.01)
*H03G 5/16* (2006.01)
*H04R 5/04* (2006.01)

(58) Field of Classification Search
CPC ....... H04R 29/001; H04R 29/002; G06F 3/16; G06F 3/162; G06F 3/165; G06F 3/167; H04G 5/005; H04G 5/16; H04W 88/02; H04W 88/025; H04W 88/021; H04W 88/22; H04W 88/23; H04W 88/026; H04W 88/027; H04W 88/028; H04W 88/04; H04W 88/06; H04M 1/00; H04M 1/02; H04M 1/0202; H03G 5/16; H03G 5/165; H03G 5/18; H03G 5/20; H03G 5/21; H03G 5/22; H03G 5/24; H03G 5/26; H03G 5/28; H03G 5/005
USPC ... 381/98, 99, 100, 101, 102, 103, 104, 105, 381/107, 111, 116, 117, 118, 119, 120, 381/121, 123, 80, 81; 700/94
See application file for complete search history.

(56) References Cited

FOREIGN PATENT DOCUMENTS

| | | | | | |
|---|---|---|---|---|---|
| JP | 06232667 | A | * | 8/1994 | ............... H04R 3/00 |
| JP | H06-232667 | | | 8/1994 | |
| JP | H07-007351 | | | 1/1995 | |
| JP | 2008-078955 | | | 4/2008 | |
| JP | 2008078955 | A | * | 4/2008 | ............... H04R 3/00 |
| JP | 2011-135178 | | | 7/2011 | |

* cited by examiner

TERMINAL DEVICE, CONTROL METHOD, AND AUDIO DATA REPRODUCTION SYSTEM

CROSS REFERENCE TO RELATED APPLICATIONS

This application is a national stage application under 35 U.S.C. 371 and claims the benefit of PCT Application No. PCT/JP2018/002069 having an international filing date of 24 Jan. 2018, which designated the United States, which PCT application claimed the benefit of Japanese Patent Application No. 2017-047678 filed 13 Mar. 2017, the entire disclosures of each of which are incorporated herein by reference.

TECHNICAL FIELD

The present disclosure relates to a terminal device, a control method, and an audio data reproduction system.

BACKGROUND ART

Technologies have conventionally been devised for transmitting audio data between devices (see, for example, Patent Document 1).

CITATION LIST

Patent Document

Patent Document 1: Japanese Patent No. 5120474

SUMMARY OF THE INVENTION

Problems to be Solved by the Invention

In a case where audio data is transmitted between devices, in a case where sound quality adjustment for the audio data is performed by the device on the transmission side, and sound quality adjustment for the audio data is performed also in the device on the reception side, double sound quality adjustment is performed for the audio data, and there is a possibility that reproduction may be performed with sound quality not intended by a user.

Thus, it is an object of the present disclosure to provide a terminal device, a control method, and an audio data reproduction system that prevent audio data from being reproduced with sound quality not intended by the user due to double sound quality adjustment performed on the audio data.

Solutions to Problems

The present disclosure is, for example,
a terminal device including:
a communication unit that communicates with an audio reproduction device;
a sound quality adjustment unit that performs sound quality adjustment on audio data; and
a control unit that determines whether or not the audio reproduction device has a sound quality adjustment function depending on a communication result of communication based on a predetermined protocol, and turns on or off the sound quality adjustment function of the sound quality adjustment unit depending on a determination result.

The present disclosure is, for example,
a control method including:
communicating with an audio reproduction device, by a communication unit;
performing sound quality adjustment on audio data, by a sound quality adjustment unit, and
determining whether or not the audio reproduction device has a sound quality adjustment function depending on a communication result of communication based on a predetermined protocol, and turning on or off the sound quality adjustment function of the sound quality adjustment unit depending on a determination result, by a control unit.

The present disclosure is, for example,
an audio data reproduction system including
a terminal device, and an audio reproduction device connected to the terminal device, in which
the terminal device includes:
a first communication unit that communicates with the audio reproduction device;
a sound quality adjustment unit that performs sound quality adjustment on audio data; and
a control unit that determines whether or not the audio reproduction device has a sound quality adjustment function depending on a communication result of communication based on a predetermined protocol, and turns on or off the sound quality adjustment function of the sound quality adjustment unit depending on the determination result, in which
after on or off of the sound quality adjustment function of the sound quality adjustment unit is determined by the control unit, the communication unit transmits, to the audio reproduction device, the audio data on which the sound quality adjustment function is performed or the audio data on which the sound quality adjustment function is not performed, and
the audio reproduction device includes:
a second communication unit that communicates with the terminal device; and
an audio data reproduction unit that reproduces the audio data transmitted from the terminal device.

Effects of the Invention

According to at least an embodiment of the present disclosure, audio data can be prevented from being reproduced with sound quality not intended by the user due to double sound quality adjustment performed on the audio data. Note that, the effect described here is not necessarily limited, and may be any effect described in the present disclosure. Furthermore, the contents of the present disclosure are not to be construed as being limited by the exemplified effect.

MODE FOR CARRYING OUT THE INVENTION

Hereinafter, an embodiment and the like of the present disclosure will be described with reference to the drawings. Note that, description will be made in the following order.

<1. One embodiment>
<2. Modifications>

The embodiment and the like described below are preferred specific examples of the present disclosure, and the contents of the present disclosure are not limited to the embodiment and the like.

1. One Embodiment

Configuration Example of Audio Data Reproduction System

Figure 1:
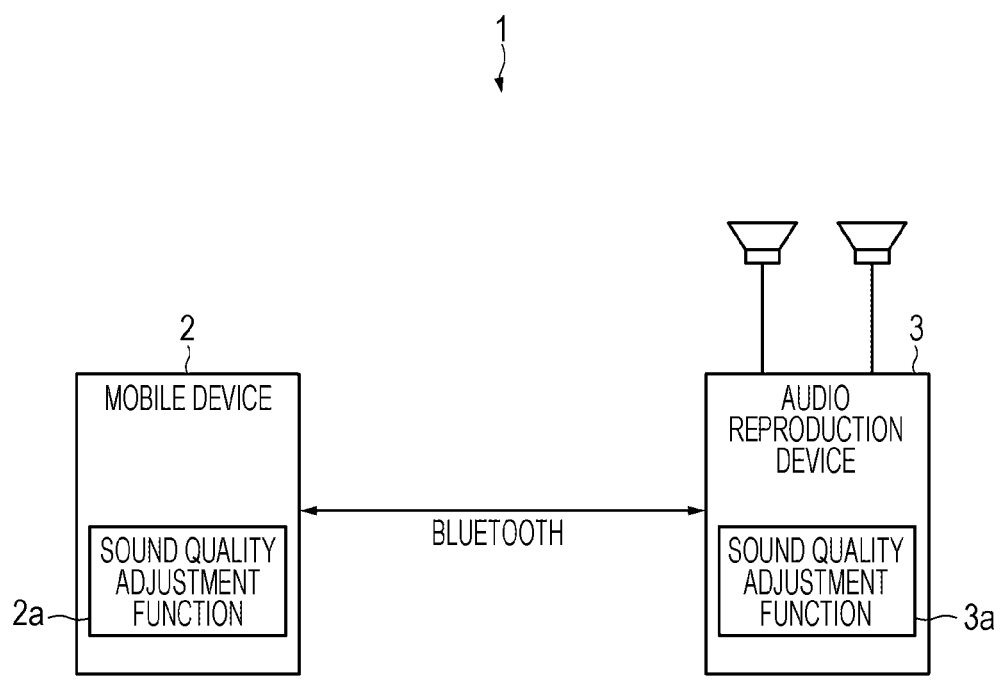
FIG. 1 is a diagram illustrating a configuration example of an audio data reproduction system according to an embodiment.

FIG. 1 illustrates a configuration example of an audio data reproduction system 1 according to an embodiment of the present disclosure. The audio data reproduction system 1 includes, for example, a mobile device 2 as a terminal device, and an audio reproduction device 3.

Examples of the mobile device 2 include a smartphone, a portable personal computer, a portable audio player, and the like. The mobile device 2 has a sound quality adjustment function 2a that performs sound quality adjustment on audio data. Examples of the sound quality adjustment function 2a include an equalizer function, a sound field adjustment function, a sound effect addition function, a function to make sound quality optimal for hardware, and the like. The sound quality adjustment function 2a may be a function originally provided to the mobile device 2, or may be a function provided by installation of a predetermined application on the mobile device 2.

Examples of the audio reproduction device 3 include a portable speaker device, a mobile device, and the like. The audio reproduction device 3 has a function of reproducing audio data transmitted (sent) from, for example, the mobile device 2. Furthermore, the audio reproduction device 3 has a sound quality adjustment function 3a that performs sound quality adjustment on the audio data transmitted (sent) from, for example, the mobile device 2. Examples of the sound quality adjustment function 3a include an equalizer function, a sound field adjustment function, a sound effect addition function, a function to make sound quality optimal for hardware, and the like. Note that, a case is also assumed where the audio reproduction device 3 does not have the sound quality adjustment function 3a. Note that, the sound quality adjustment function 2a of the mobile device 2 may be different from the sound quality adjustment function 3a of the audio reproduction device 3.

Communication based on a predetermined communication standard (for example, near field communication) is performed between the mobile device 2 and the audio reproduction device 3. Examples of the communication based on the predetermined communication standard include Bluetooth (registered trademark), and Wi-Fi (registered trademark). Note that, communication based on wired communication may be performed between the mobile device 2 and the audio reproduction device 3.

Configuration Example of Terminal Device

Figure 2:
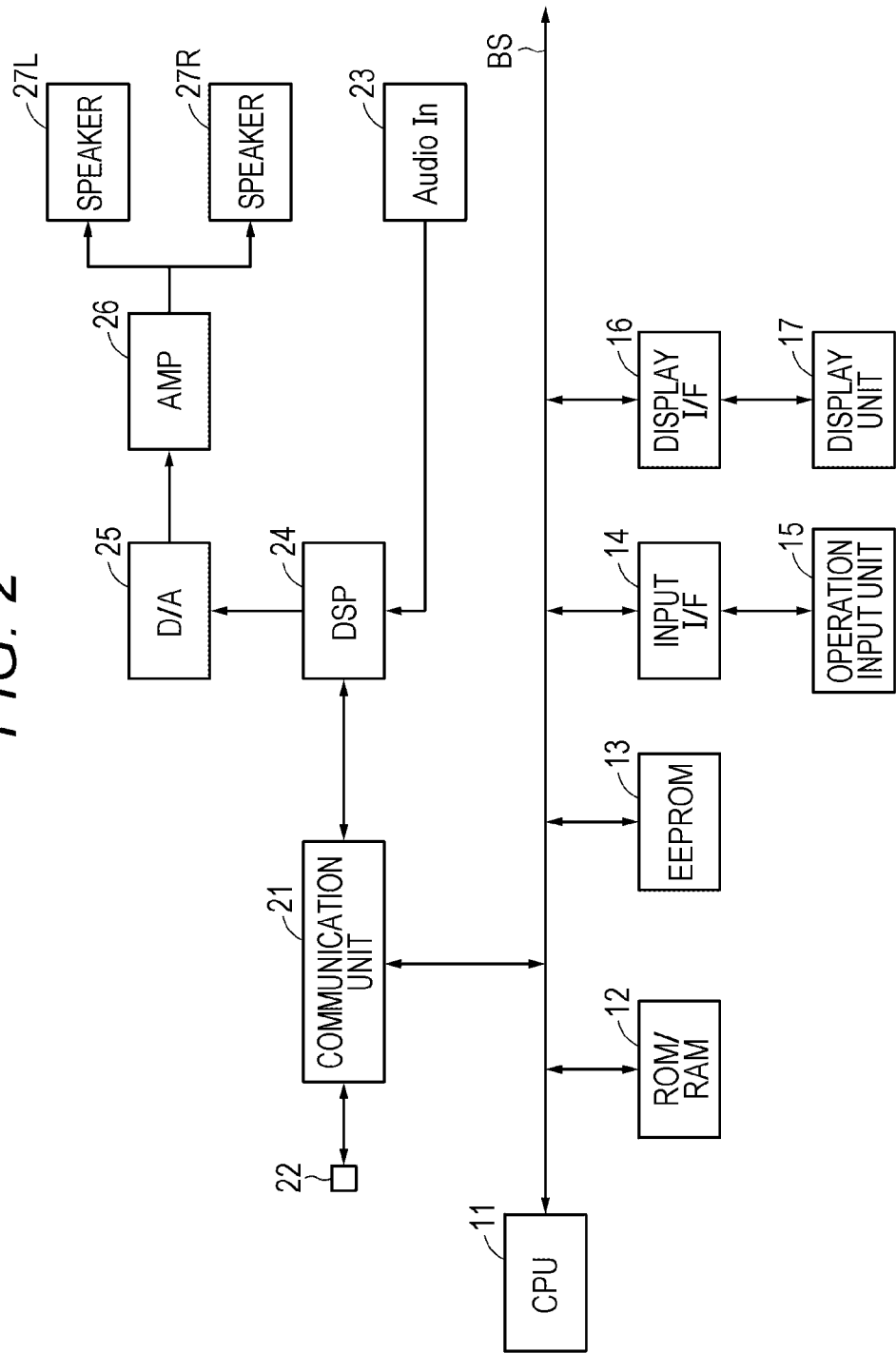
FIG. 2 is a block diagram illustrating a configuration example of a terminal device according to the embodiment.

FIG. 2 is a block diagram illustrating a configuration example of the mobile device 2. The mobile device 2 includes a central processing unit (CPU) 11 as an example of a control unit, a read only memory (ROM)/random access memory (RAM) 12, an electrically erasable programmable read only memory (EEPROM) 13, an input interface (I/F) 14, an operation input unit 15, a display I/F 16, a display unit 17, a communication unit 21, a communication input/output unit 22 such as an antenna, an audio input terminal (Audio In) 23, a digital signal processor (DSP) 24, a digital to analog (D/A) 25, an amplifier (AMP) 26, a speaker 27L, and a speaker 27R. The CPU 11, the ROM/RAM 12, the EEPROM 13, the input I/F 14, the display I/F 16, the display unit 17, and the communication unit 21 are connected to each other via a bus BS.

The CPU 11 controls each part of the mobile device 2. Although details will be described later, the CPU 11 determines whether or not the audio reproduction device 3 has the sound quality adjustment function 3a depending on a communication result of communication based on a predetermined protocol, and turns on or off the sound quality adjustment function 2a depending on a determination result.

The ROM/RAM 12 is a generic term for ROM and RAM. The ROM stores a program to be executed by the CPU 11. In addition to being used as a work area when the CPU 11 executes the program, the RAM is also used as a buffer memory for audio data. The EEPROM 13 stores information regarding settings of the mobile device 2, and the like.

The input I/F 14 is an interface for outputting an operation signal from the operation input unit 15 to the CPU 11 or the like. The operation input unit 15 is a generic term of a configuration for accepting operation of a user with a key, a touch panel, voice, gesture, or the like. The operation signal is generated depending on the operation accepted by the operation input unit 15, and the generated operation signal is transmitted to the CPU 11 via the input I/F 14. The CPU 11 executes control depending on the operation signal.

The display I/F 16 is an interface that outputs a display control signal related to display to the display unit 17. The display unit 17 performs control depending on the display control signal supplied via the display I/F 16. Examples of the display unit 17 include a liquid crystal display (LCD) and an organic electro luminescence (EL). The display unit 17 may be configured as a touch Panel, and an operation signal obtained by use of the touch panel may be supplied to the CPU 11 via the display I/F 16.

The communication unit 21 performs communication based on Bluetooth and communication based on a dedicated protocol, with the audio reproduction device 3 depending on the control of the CPU 11. Furthermore, the communication unit 21 communicates with the audio reproduction device 3 depending on the control of the CPU 11, and transmits audio data to the audio reproduction device 3. The communication input/output unit 22 is an antenna or the like for performing communication as described above.

The audio input terminal 23 is a terminal to which audio data is input. Audio data acquired via a compact disc (CD), a digital versatile disc (DVD), a semiconductor memory, the Internet, or the like is input to the audio data input terminal.

The DSP 24 as a sound quality adjustment unit performs, on audio data, digital signal processing based on the sound quality adjustment function 2a. In a case where audio data input via the audio input terminal 23 or the like is analog audio data, for example, the audio data is converted into digital audio data by an analog to digital (A/D) conversion function of the DSP 24.

The D/A 25 converts, into analog audio data, the audio data on which the signal processing by the DSP 24 is performed. Output of the D/A 25 is supplied to the amplifier 26. Audio data amplified at a predetermined amplification factor by the amplifier 26 is reproduced from the speakers 27L and 27R. For example, the DSP 24, the D/A 25, the amplifier 26, and the speakers 27L and 27R constitute an audio data reproduction unit for reproducing audio data.

Note that, the mobile device 2 includes a memory of at least one of a built-in memory or a removable memory, and the memory stores audio data to be transmitted to the audio reproduction device 3. The audio data input from the audio input terminal 23 may be transmitted to the audio reproduction device 3.

The configuration example described above can also be applied to the audio reproduction device 3. Of course, the configurations of the mobile device 2 and the audio reproduction device 3 may be different from each other (for example, presence or absence of a component, physical size of each component, or the like). For example, the audio reproduction device 3 does not have to include the display unit 17.

Problems to be Considered in Audio Data Reproduction System

Next, problems will be described to be considered in the audio data reproduction system. In a music player application of the mobile device 2 having the sound quality adjustment function 2a, in a case where the mobile device 2 is connected to the audio reproduction device 3 by using Bluetooth, the audio reproduction device 3 may have the sound quality adjustment function 3a. In such a case, depending on a setting status, while the sound quality adjustment function 2a is performed on audio data on the mobile device 2 side and transmitted, the sound quality adjustment function 3a is performed on the transmitted audio data also on the audio reproduction device 3 side. In other words, the sound quality adjustment function is doubled on the audio data, and the audio data may be reproduced with sound quality not intended by the user.

For the user, resetting the sound quality adjustment function on the mobile device 2 side or the audio reproduction device 3 side for each connection is a very troublesome operation and not practical. Furthermore, the user has to be conscious and confirm whether the audio reproduction device 3 side has the sound quality adjustment function 3a, and in some cases, there is a possibility that the sound quality adjustment function is doubled without being known, and the user views and listens to music with unintended bad sound quality.

Therefore, in the present embodiment, in addition to communication by Bluetooth, communication by a dedicated protocol is performed to determine whether or not the mobile device 2 (an application of the mobile device 2) and the audio reproduction device 3 can be communicated with each other, and if the audio reproduction device 3 is compatible with the dedicated protocol, it is regarded that the device has the sound quality adjustment function 3a, and the sound quality adjustment function 2a of the mobile device 2 (application side) is automatically turned off. Furthermore, the device is made to have a function of automatically canceling the off state of the sound quality adjustment function 2a if the connection with the target device is released.

Processing in One Embodiment

Figure 3:
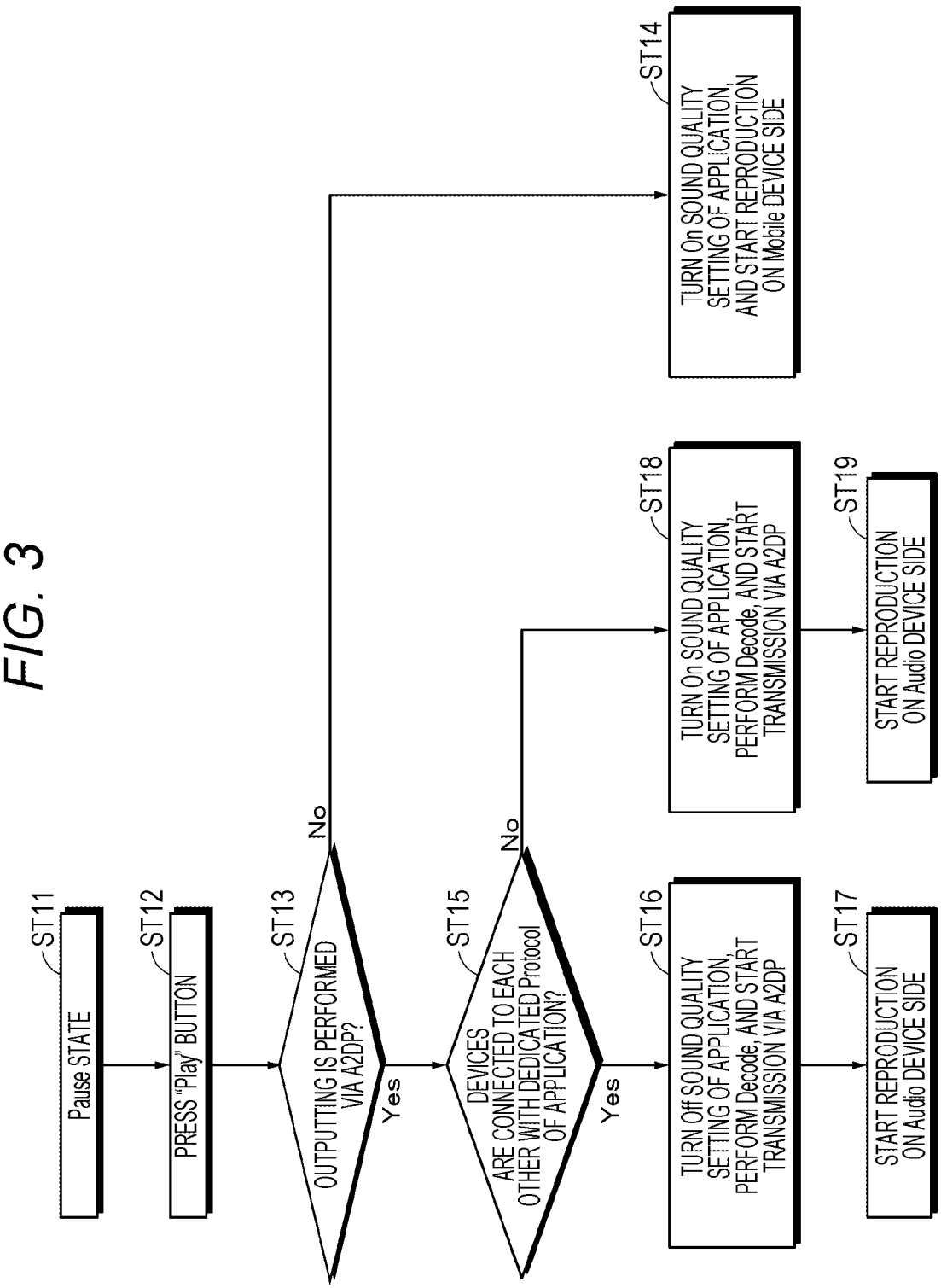
FIG. 3 is a flowchart illustrating a flow of processing performed by the terminal device according to the embodiment.

FIG. 3 is a flowchart illustrating a flow of processing in the mobile device 2 according to the embodiment. Note that, in this example, description will be made assuming that the application installed in the mobile device 2 has the sound quality adjustment function 2a. Furthermore, the description will be made assuming that, in the application, a state transition is made between two states (a Pause state (a state where audio reproduction is not performed) and a Play state (a state where audio reproduction is performed)).

For example, it is assumed that an initial state is the Pause state (step ST11). Then, the processing proceeds to step ST12. In step ST12, instruction operation is performed to reproduce music. For example, a Play button is pressed (the button may be a button on the touch panel, or may be a mechanical button). Then, the processing proceeds to step ST13.

In step ST13, the CPU 11 determines whether or not the communication unit 21 of the mobile device 2 performs outputting via Advanced Audio Distribution Profile (A2DP). Note that, A2DP is a group of profiles for transmitting high-quality audio data by using Bluetooth. If a result of step ST13 is negative determination, the processing proceeds to step ST14.

In step ST14, outputting is not performed via A2DP, in other words, communication is not performed with another device (for example, the audio reproduction device 3), so that the CPU 11 determines that an instruction is issued to reproduce audio data on the mobile device 2 side. In this case, since there is no possibility that the sound quality adjustment function to the audio data is doubled, the CPU 11 instructs the DSP 24 to turn on the sound quality adjustment function 2a. Then, the audio data on which the sound quality adjustment function 2a by the DSP 24 is performed is reproduced on the mobile device 2 side.

In step ST13, in a case where the communication unit 21 of the mobile device 2 performs outputting via A2DP, the processing proceeds to step ST15. In step ST15, it is determined whether or not the mobile device 2 and the audio reproduction device 3 are connected to each other with the dedicated protocol of the application. In a case where the mobile device 2 and the audio reproduction device 3 are connected to each other (communicated with each other) with the dedicated protocol of the application, the CPU 11 of the mobile device 2 determines that the audio reproduction device 3 side has the sound quality adjustment function 3a. Furthermore, in a case where the devices are not connected to each other (not communicated with each other) with the dedicated protocol of the application, the CPU 11 of the mobile device 2 determines that the audio reproduction device 3 side does not have the sound quality adjustment function 3a.

In a case where the mobile device 2 and the audio reproduction device 3 are connected to each other with the dedicated protocol of the application in step ST15, the processing proceeds to step ST16. In this case, the CPU 11 of the mobile device 2 determines that the audio reproduction device 3 has the sound quality adjustment function 3a, and decodes the audio data as appropriate in a state where the sound quality adjustment function 2a (sound quality setting) of the application is turned off, and transmits the decoded audio data via A2DP. Then, the processing proceeds to step ST17.

In step ST17, the audio data transmitted from the mobile device 2 is received by the audio reproduction device 3 on the audio device side. The sound quality adjustment function 3a is performed on the transmitted audio data. Music corresponding to the audio data on which the sound quality adjustment function 3a is performed is reproduced from the audio reproduction device 3 (sound is output).

In a case where the mobile device 2 and the audio reproduction device 3 are not connected to each other with the dedicated protocol of the application in step ST15, the processing proceeds to step ST18. In this case, the CPU 11 of the mobile device 2 determines that the audio reproduction device 3 does not have the sound quality adjustment function 3a, and decodes the audio data as appropriate in a state where the sound quality adjustment function 2a (sound quality setting) of the application is turned on, and transmits the decoded audio data via A2DP. Then, the processing proceeds to step ST19.

In step ST19, the sound quality adjustment function 2a is performed on the mobile device 2 side, and the audio data transmitted from the mobile device 2 is received by the audio reproduction device 3 on the audio device side. Music corresponding to the transmitted audio data is reproduced from the audio reproduction device 3 (sound is output).

In the present embodiment, it is difficult to accurately detect connection/disconnection to/from a target audio device (for example, the audio reproduction device 3) 100% accurately in the protocol, and on/off of the sound quality adjustment function is made to be switchable depending on whether or not the devices are connected to each other at Play/Pause timing.

Note that, in the present embodiment, in consideration of a case where a protocol is not defined for acquiring presence or absence of the sound quality adjustment function 3a of the audio reproduction device 3, determination is made depending on whether or not communication can be performed by the dedicated protocol. Then, in a case where communication can be performed by the dedicated protocol, it is determined that the device is compatible with the music player application and the device has the sound quality adjustment function. Note that, in a case where the protocol is defined for acquiring the presence or absence of the sound quality adjustment function 3a of the audio reproduction device 3, on/off of the sound quality adjustment function 2a of the mobile device 2 may be switched depending on a result of acquiring the presence or absence of the sound quality adjustment function.

Effects in One Embodiment

According to the present embodiment, the user can view and listen to music with sound quality adapted to a connection state between devices without consciously performing operation. Furthermore, it can be prevented that double sound quality adjustment is performed on audio data and the audio data is reproduced.

2. Modifications

The embodiment of the present disclosure has been specifically described above, but the contents of the present disclosure are not limited to the above-described embodiment, and various modifications can be made based on the technical idea of the present disclosure.

The music player application installed in the mobile device may have a remote control function for the audio reproduction device, and may have a function capable of changing settings regarding the sound quality adjustment function on the audio reproduction device side. On the other hand, it is also possible to change settings regarding the sound quality adjustment function on the mobile device side. In other words, when both sound quality adjustment functions are enabled, setting screens of two sound quality adjustment functions may be displayed on the screen of the application of the mobile device, and the user may be confused. Therefore, when the mobile device and the audio device are connected to each other (for example, when the sound quality adjustment function of the mobile device is turned off and the mobile device and the audio device are connected to each other), only the setting screen regarding the sound quality adjustment of the audio reproduction device may be displayed on the screen. As a result, the user can perform setting of the sound quality adjustment function without being confused.

The configurations, methods, processes, shapes, materials, numerical values, and the like in the embodiment described above are merely examples, and different configurations, methods, processes, shapes, materials, numerical values, and the like may be used as necessary. The above-described embodiment and modifications can be combined as appropriate.

The present disclosure can also adopt the following configurations.

(1)

A terminal device including:

a communication unit that communicates with an audio reproduction device;

a sound quality adjustment unit that performs sound quality adjustment on audio data; and a control unit that determines whether or not the audio reproduction device has a sound quality adjustment function depending on a communication result of communication based on a predetermined protocol, and turns on or off the sound quality adjustment function of the sound quality adjustment unit depending on a determination result.

(2)

The terminal device according to (1), in which after on/off of the sound quality adjustment function of the sound quality adjustment unit is determined by the control unit, the communication unit transmits, to the audio reproduction device, the audio data on which the sound quality adjustment function is performed or the audio data on which the sound quality adjustment function is not performed.

(3)

The terminal device according to (1) or (2), in which the control unit determines whether or not the audio reproduction device has a sound quality adjustment function in response to instruction operation to reproduce audio data.

(4)

The terminal device according to any of (1) to (3), further including a display unit, in which a sound quality adjustment setting screen of the audio reproduction device is displayed on the display unit while connection with the audio reproduction device is established in a state where the sound quality adjustment function is turned off.

(5)

The terminal device according to any of (1) to (4), further including an audio data reproduction unit.

(6)

A control method including:

communicating with an audio reproduction device, by a communication unit;

performing sound quality adjustment on audio data, by a sound quality adjustment unit, and determining whether or not the audio reproduction device has a sound quality adjustment function depending on a communication result of communication based on a predetermined protocol, and turning on or off the sound quality adjustment function of the sound quality adjustment unit depending on a determination result, by a control unit.

(7)

An audio data reproduction system including a terminal device, and an audio reproduction device connected to the terminal device, in which the terminal device includes:
a first communication unit that communicates with the audio reproduction device;
a sound quality adjustment unit that performs sound quality adjustment on audio data; and
a control unit that determines whether or not the audio reproduction device has a sound quality adjustment function depending on a communication result of communication based on a predetermined protocol, and turns on or off the sound quality adjustment function of the sound quality adjustment unit, in which
after on or off of the sound quality adjustment function of the sound quality adjustment unit is determined by the control unit, the communication unit transmits, to the audio reproduction device, the audio data on which the sound quality adjustment function is performed or the audio data on which the sound quality adjustment function is not performed, and
the audio reproduction device includes:
a second communication unit that communicates with the terminal device; and
an audio data reproduction unit that reproduces the audio data transmitted from the terminal device.

REFERENCE SIGNS LIST

1 Audio data reproduction system
11 CPU
21 Communication unit
24 DSP

What is claimed is:
1. A terminal device comprising:
a communication unit that communicates with an audio reproduction device;
a sound quality adjustment unit that performs sound quality adjustment on audio data; and
a control unit that determines whether a communication between the communication unit and the audio reproduction device is performed by a dedicated communication protocol of a music application, and in response to the communication between the communication unit and the audio reproduction device being performed by the dedicated communication protocol of the music application, turning off a sound quality adjustment function of the sound quality adjustment unit;
a display unit, wherein only a sound quality adjustment setting screen of the audio reproduction device is displayed on the display unit while connection with the audio reproduction device is established in a state where the sound quality adjustment unit of the terminal device is turned off.
2. The terminal device according to claim 1, further comprising:
the communication unit transmits, to the audio reproduction device, the audio data on which the sound quality adjustment function is not performed.
3. The terminal device according to claim 1, wherein
the control unit determines whether or not the audio reproduction device has the sound quality adjustment function in response to an instruction operation to reproduce audio data.

4. The terminal device according to claim 1, further comprising
an audio data reproduction unit.
5. A control method comprising:
communicating with an audio reproduction device, by a communication unit of a terminal device;
determining whether a communication between the communication unit and the audio reproduction device is performed using a dedicated protocol of a music application;
if the communication between the communication unit and the audio reproduction device is not performed using the dedicated protocol of the music application, then performing sound quality adjustment on audio data, by a sound quality adjustment unit of the terminal device, and
if the communication between the communication unit and the audio reproduction device is performed using the dedicated protocol of the music application, then turning off a sound quality adjustment function of the sound quality adjustment unit of the terminal device, by a control unit of the terminal device, and wherein
only a sound quality adjustment setting screen of the audio reproduction device is displayed on a display unit of the terminal device while connection with the audio reproduction device is established in a state where the sound quality adjustment unit of the terminal device is turned off.
6. An audio data reproduction system comprising
a terminal device, and an audio reproduction device connected to the terminal device, wherein
the terminal device includes:
a first communication unit that communicates with the audio reproduction device;
a sound quality adjustment unit that performs sound quality adjustment on audio data; and
a control unit that determines whether t, communication between the first communication unit and the audio reproduction device is performed using a dedicated protocol of a music application on the terminal device, wherein
if the communication between the first communication unit and the audio reproduction device is not performed using the dedicated protocol of the music application, then turning on a sound quality adjustment function of the sound quality adjustment unit;
if the communication between the first communication unit and the audio reproduction device is performed using the dedicated protocol of the music application, then turning off the sound quality adjustment function of the sound quality adjustment unit; and
the first communication unit transmits, to the audio reproduction device, the audio data; and
a display unit, wherein only a sound quality adjustment setting screen of the audio reproduction device is displayed on the display unit while connection with the audio reproduction device is established in a state where the sound quality adjustment unit of the terminal device is turned off,
the audio reproduction device includes:
a second communication unit that communicates with the terminal device; and
an audio data reproduction unit that reproduces the audio data transmitted from the terminal device.

* * * * *